(12) United States Patent
Park et al.

(10) Patent No.: US 12,328,966 B2
(45) Date of Patent: Jun. 10, 2025

(54) SUBSTRATE FOR OPTICAL DEVICE, METHOD OF MANUFACTURING THE SAME, OPTICAL DEVICE INCLUDING THE SUBSTRATE FOR OPTICAL DEVICE, METHOD OF MANUFACTURING THE SAME, AND ELECTRONIC APPARATUS INCLUDING OPTICAL DEVICE

(71) Applicant: SAMSUNG ELECTRONICS CO., LTD., Suwon-si (KR)

(72) Inventors: Changyoung Park, Yongin-si (KR); Sanghun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/734,414

(22) Filed: May 2, 2022

(65) Prior Publication Data
US 2023/0170430 A1 Jun. 1, 2023

(30) Foreign Application Priority Data
Nov. 30, 2021 (KR) .................. 10-2021-0169528

(51) Int. Cl.
*H10F 77/169* (2025.01)
*H10F 30/225* (2025.01)
(Continued)

(52) U.S. Cl.
CPC ......... *H10F 77/169* (2025.01); *H10F 30/225* (2025.01); *H10F 71/1276* (2025.01); *H10F 77/124* (2025.01)

(58) Field of Classification Search
CPC ............ H01L 31/0392; H01L 31/0304; H01L 31/107; H01L 31/1852; H01L 31/035236;
(Continued)

(56) References Cited

U.S. PATENT DOCUMENTS 5,443,685 A * 8/1995 Goossen ............. H01L 21/3083
438/933
7,566,898 B2 7/2009 Hudait et al.
(Continued)

FOREIGN PATENT DOCUMENTS

JP 0723039 A2 * 7/1996
KR 10-2283699 B1 7/2021

OTHER PUBLICATIONS

R. Harper et al., "III/V on large diameter silicon substrates using LPCVD germanium templates," 2014 7th International Silicon-Germanium Technology and Device Meeting (ISTDM), Singapore, 2014, pp. 23-24, doi: 10.1109/ISTDM.2014.6874678 (Year: 2014).*

*Primary Examiner* — Sitaramarao S Yechuri
(74) *Attorney, Agent, or Firm* — Sughrue Mion, PLLC

(57) ABSTRACT

Provided is a high-quality substrate including a silicon layer, a multilayer buffer layer on the silicon layer, and an indium phosphide (InP) layer on the multilayer buffer layer, wherein a crystal growth direction of the silicon layer is a direction inclined by 1° to 10° with respect to a vertical direction, and wherein the multilayer buffer layer includes a buffer layer in which a crystal growth direction is inclined with respect to the vertical direction.

20 Claims, 13 Drawing Sheets

(51) Int. Cl.
*H10F 71/00* (2025.01)
*H10F 77/124* (2025.01)

(58) Field of Classification Search
CPC ............... H01L 31/036; H01L 31/1844; H01L 31/03046; H01L 31/184; H10F 77/169; H10F 77/124; H10F 77/146; H10F 77/16; H10F 77/1248; H10F 30/225; H10F 71/1276; H10F 71/1272; H10F 71/127
See application file for complete search history.

(56) References Cited

U.S. PATENT DOCUMENTS

| | | |
|---|---|---|
| 7,714,292 B2 | 5/2010 | Agarwal et al. |
| 7,843,030 B2 | 11/2010 | Singh |
| 7,932,496 B2 | 4/2011 | Kato et al. |
| 8,772,729 B1 * | 7/2014 | Brown .................... B82Y 30/00 250/370.07 |
| 2008/0210927 A1 | 9/2008 | Hudait et al. |
| 2008/0230862 A1 | 9/2008 | Singh |
| 2009/0008566 A1 | 1/2009 | Agarwal et al. |
| 2010/0133585 A1 * | 6/2010 | Kim .................... H01L 21/0245 117/88 |
| 2012/0235040 A1 * | 9/2012 | Ouchi ................ G01N 21/3586 257/85 |
| 2021/0199769 A1 | 7/2021 | Meylan |
| 2021/0242362 A1 | 8/2021 | Park et al. |
| 2022/0102573 A1 | 3/2022 | Park et al. |

* cited by examiner

SUBSTRATE FOR OPTICAL DEVICE, METHOD OF MANUFACTURING THE SAME, OPTICAL DEVICE INCLUDING THE SUBSTRATE FOR OPTICAL DEVICE, METHOD OF MANUFACTURING THE SAME, AND ELECTRONIC APPARATUS INCLUDING OPTICAL DEVICE

CROSS-REFERENCE TO RELATED APPLICATION

This application claims priority to Korean Patent Application No. 10-2021-0169528, filed on Nov. 30, 2021, in the Korean Intellectual Property Office, the disclosure of which is incorporated by reference herein in its entirety.

BACKGROUND

1. Field

Example embodiments of the disclosure relate to substrates for optical devices, and their application, and more particularly, to substrates for optical devices, methods of manufacturing the same, optical devices including the substrates, methods of manufacturing the optical devices, and electronic apparatuses including the optical devices.

2. Description of Related Art

In order to manufacture an indium gallium arsenide (InGaAs) avalanche photodiode (APD) chip, an indium phosphide (InP) substrate is used, and the InP substrate is more expensive than a silicon substrate. Therefore, when an APD chip is manufactured by using an InP substrate, the manufacturing cost of the chip is increased.

In order to manufacture an InGaAs APD chip on a silicon substrate, the formation of a single-crystal InP surface is required. To avoid this problem, even if a method of step by step increasing a lattice constant is applied, defects occurring at an interface with the silicon substrate cannot be reduced, and thus, it is difficult to form a high-quality crystal InP surface.

SUMMARY

One or more example embodiments provide high-quality substrates for manufacturing high-performance optical devices.

One or more example embodiments also provide substrates for an optical device capable of reducing manufacturing cost.

One or more example embodiments also provide optical devices formed on the substrates.

One or more example embodiments also provide methods of manufacturing the substrates and the optical devices.

One or more example embodiments provide electronic apparatuses including the optical devices.

Additional aspects will be set forth in part in the description which follows and, in part, will be apparent from the description, or may be learned by practice of example embodiments of the disclosure.

According to an aspect of an example embodiment, there is provided a high-quality substrate including a silicon layer, a multilayer buffer layer on the silicon layer, and an indium phosphide (InP) layer on the multilayer buffer layer, wherein a crystal growth direction of the silicon layer is a direction inclined by 1° to 10° with respect to a vertical direction, and wherein the multilayer buffer layer includes a buffer layer in which a crystal growth direction is inclined with respect to the vertical direction.

The multilayer buffer layer may further include a first buffer layer on the silicon layer, a second buffer layer on the first buffer layer, and a third buffer layer on the second buffer layer, wherein a crystal growth direction of the first buffer layer is inclined with respect to the vertical direction.

The first buffer layer may include a germanium (Ge) layer having a thickness in a range of 0.01 μm to 100 μm, and the crystal growth direction of the first buffer layer may be inclined by 1° to 10° with respect to the vertical direction.

The second buffer layer may be a single layer or multilayer including at least a gallium arsenide (GaAs) layer having a thickness in a range of 0.01 μm to 100 μm.

The third buffer layer may include a first layer, and a second layer on the first layer, wherein the first layer and the second layer are repeatedly and alternately stacked, and wherein the first layer and the second layer are each a superlattice layer.

One of the first layer and the second layer may include a gallium arsenide (GaAs) layer, an indium gallium arsenide (InGaAs) layer, or an indium gallium aluminum arsenide (InGaAlAs) layer, and the other of the first layer and the second layer may include an aluminum arsenide (AlAs) layer, an InAlAs layer, or an InGaAlAs layer.

The InP layer may include an n+InP layer having a thickness in a range of 0.01 μm to 100 μm.

The InP layer may be a single layer or multilayer.

According to an aspect of another example embodiment, there is provided an optical device including a substrate, a first stack on the substrate, a second stack facing the first stack, and an absorption layer having a thickness in a range of 0.05 μm to 20 μm, between the first stack and the second stack, wherein the substrate includes a high-quality substrate including a silicon layer, a multilayer buffer layer on the silicon layer, and an indium phosphide (InP) layer on the multilayer buffer layer, wherein a crystal growth direction of the silicon layer is a direction inclined by 1° to 10° with respect to a vertical direction, and wherein the multilayer buffer layer includes a buffer layer in which a crystal growth direction is inclined with respect to the vertical direction.

A surface of the InP layer may include an n+InP layer.

The first stack may be configured as a charge multiplication layer, and may include an n-type doped layer, an undoped layer on the n-type doped layer, and a p-type doped layer on the undoped layer.

The second stack may include a first p-type doped layer on the absorption layer, the first p-type doped layer being a light-receiving layer, and a second p-type doped layer on the first p-type doped layer, the second p-type doped layer being a p-type electrode contact.

The optical device may further include a graded layer between at least one of the first stack, the second stack, and the absorption layer, the graded layer being configured to mitigate a band gap difference between the at least one of the first stack, the second stack, and the absorption layer.

According to an aspect of another example embodiment, there is provided a method of manufacturing a high-quality substrate, the method including forming a silicon layer having a crystal growth direction inclined at a given angle with respect to the vertical direction, forming a multilayer buffer layer on the silicon layer, and forming an indium phosphide (InP) layer on the multilayer buffer layer, wherein among the multilayer buffer layer, a buffer layer formed directly on the silicon layer is grown in a crystal growth direction of the silicon layer to reduce defects at an interface between the silicon layer and the buffer layer.

The forming of the multilayer buffer layer may include growing a first buffer layer on the silicon layer, growing a second buffer layer on the first buffer layer, and growing a third buffer layer on the second buffer layer.

The growing the second buffer layer may include a first operation of growing a first portion of the second buffer layer, and a second operation of growing a second portion other than the first portion of the second buffer layer, under conditions different from conditions of the first operation.

The conditions of the first operation may be different from the conditions of the second operation, and the conditions of the first operation and the conditions of the second operation may include at least one of a temperature condition, a pressure condition, a speed condition, and a time condition.

The forming the InP layer may include a first operation of growing a first portion of the InP layer under a first condition, and a second operation of growing a second portion other than the first portion of the InP layer, under a second condition different from the first condition.

The first condition and the second condition may include at least one of a temperature condition, a pressure condition, a speed condition, and a time condition.

The forming of the InP layer my include forming a single layer or multilayer.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1:
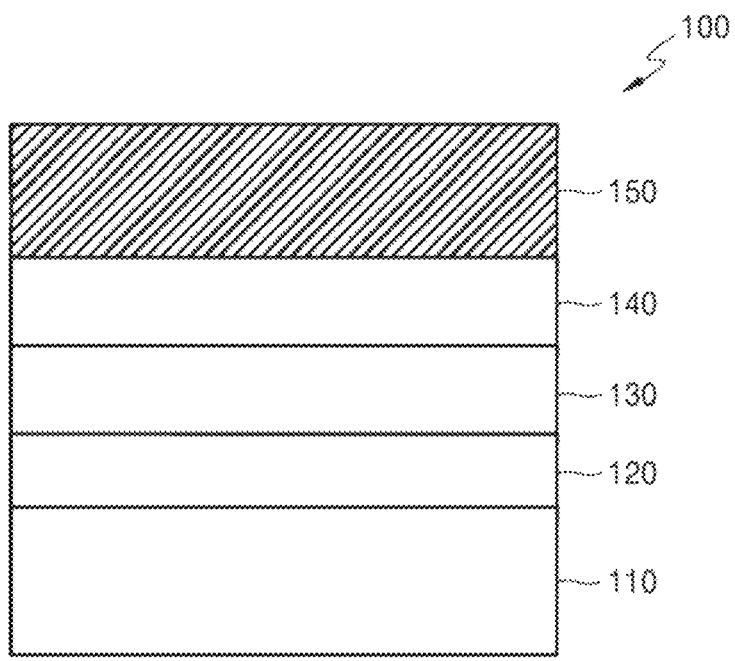
FIG. 1 is a cross-sectional view illustrating a substrate for manufacturing an optical device, that is, a substrate for an optical device, according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a substrate for an optical device, a manufacturing method thereof, an optical device including the substrate, a manufacturing method thereof, and an electronic apparatus including the optical device according to example embodiments will be described in detail with reference to the accompanying drawings.

The method of manufacturing the substrate will be described together with the description of the substrate, and the method of manufacturing the optical device will be described together with the description of the optical device.

In the following description, the thicknesses of the layers or regions shown in the drawings may be exaggerated for clarity of the specification. In addition, example embodiments are capable of various modifications and may be embodied in many different forms. In addition, when an element or layer is referred to as being "on" or "above" another element or layer, the element or layer may be directly on another element or layer or intervening elements or layers. In the description below, like reference numerals in each drawing refer to like elements.

First, a substrate for an optical device according to an example embodiment will be described.

FIG. 1 shows a substrate 100 for manufacturing an optical device, according to an example embodiment. For example, the substrate 100 may include a substrate for an avalanche photodiode (APD), but is not limited thereto. The substrate 100 may be a substrate formed based on silicon or a silicon-based substrate.

Referring to FIG. 1, the substrate 100 includes a lower layer 110, a first buffer layer 120, a second buffer layer 130, a third buffer layer 140, and an upper layer 150 that are sequentially stacked. The lower layer 110 may be a semiconductor layer or may include a semiconductor layer. For example, the lower layer 110 may be a silicon (Si) layer or may include a silicon layer, but is not limited thereto. For example, the lower layer 110 may include a silicon layer in which a crystal growth direction is off-axis, for example, the lower layer 110 may include a silicon layer in which the crystal growth direction is inclined by 1° to 10° from the vertical direction. A layer structure or a layer configuration of the first to third buffer layers 120, 130, and 140 may be different from each other. The first to third buffer layers 120, 130, and 140 may be collectively expressed as a multilayer buffer layer. For example, the multilayer buffer layer may include a buffer layer or material layer having a different layer configuration or layer structure from the first to third buffer layers 120, 130, and 140. For example, the first buffer layer 120 may be or include a semiconductor layer. For example, the first buffer layer 120 may be a germanium (Ge) layer or may include a germanium layer, but is not limited thereto. As the first buffer layer 120 is grown on the lower layer 110 having an inclined crystal growth direction, the crystal growth direction of the first buffer layer 120 is also inclined. For example, the crystal growth direction of the first buffer layer 120 may also be inclined by 1° to 10° with respect to the vertical direction. As the first buffer layer 120 is formed on the lower layer 110 having an inclined crystal growth direction, the anti-phase boundary (APB) dislocation at an interface between the lower layer 110 and the first buffer layer 120 may be reduced. For example, the thickness of the first buffer layer 120 may be in a range of about 0.1 μm to about 5 μm. The first buffer layer 120 may be formed on the lower layer 110 by using a method, such as epitaxial growth method, but is not limited thereto. The second buffer layer 130 may be a semiconductor layer or may include a semiconductor layer. For example, the second buffer layer 130 may include a compound semiconductor layer. For example, the second buffer layer 130 may be a gallium arsenide (GaAs) layer or may include a GaAs layer. For example, the thickness of the second buffer layer 130 may be in a range of about 0.1 μm to about 5 μm. The second buffer layer 130 may be formed on the first buffer layer 120 by using a growth method, such as epitaxial growth method, but is not limited thereto. The second buffer layer 130 may be a single layer or a multilayer.

Figure 2:
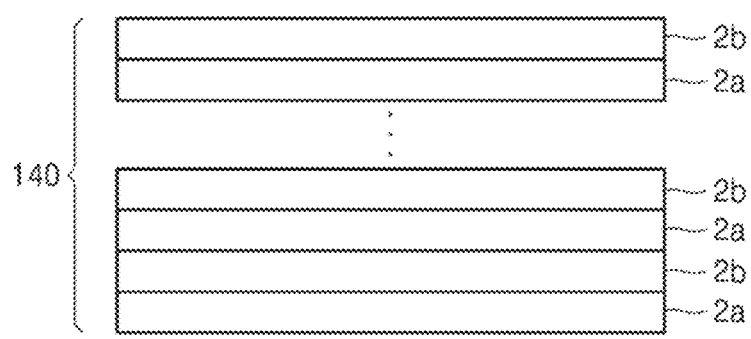
FIG. 2 is a cross-sectional view illustrating an example of a layer structure of a third buffer layer of FIG. 1.

The third buffer layer 140 may be formed to include multiple layers or may have a layer structure including multiple layers. In one example, the third buffer layer 140 may have a multilayer structure including a semiconductor layer. For example, the third buffer layer 140 may have a multilayer structure including a compound semiconductor layer. For example, the multilayer structure of the third buffer layer 140 may be formed by repeatedly and alternately stacking superlattice layers of different materials. For example, the third buffer layer 140 may include a multilayer structure in which a first layer 2a, which is a superlattice layer, and a second layer 2b, which is a superlattice layer, are repeatedly and alternately stacked as shown in FIG. 2. For example, each of the first layer 2a and the second layer 2b may be formed to have a thickness in a range of about 1 nm to about 10 nm. For example, the first layer 2a may include a GaAs layer and the second layer 2b may include an aluminum arsenide (AlAs) layer, but is not limited to these materials. For example, the number of repetitions of the first and second layers 2a and 2b may be about 5 to 100 times, but is not limited thereto, and the number of repetitions may be increased or decreased as necessary. For example, the third buffer layer 140 may be formed on the second buffer layer 130 by using an epitaxial growth method, but is not limited thereto. The upper layer 150 is the uppermost layer of the substrate 100 and may serve as a contact layer or a buffer layer. For example, the upper layer 150 may be an InP layer or may include an InP layer, but is not limited thereto. Because the upper layer 150 is grown on the third buffer layer 140 having a superlattice structure, dislocations due to lattice mismatch at an interface between the third buffer layer 140 and the upper layer 150 may be reduced. In this regards, the third buffer layer 140 may be referred to as a material layer for reducing lattice mismatch, a lattice mismatch reducing layer, or the like. For example, the upper layer 150 may be formed to have a thickness in a range of about 0.5 μm to about 20 μm. In an example, in the process of forming the upper layer 150, a partial thickness (e.g., 0.01 μm to 10 μm) may be doped with a dopant. In an example, a thickness corresponding to the partial thickness doped with a dopant may be separately grown on the upper layer 150. For example, the upper layer 150 may be a single layer or multiple layers.

When the second buffer layer 130 and the upper layer 150 are each formed as a multi-layer, a growth temperature, a growth pressure, and/or a growth time of each layer constituting the multi-layer may be different from each other. For example, when the second buffer layer 130 is formed by sequentially stacking a first GaAs layer and a second GaAs layer by using an epitaxial growth method, the first GaAs layer is grown in a first operation, and the second GaAs layer may be grown in a second operation. Process conditions (temperature, pressure, and/or time) of the first and second operations may be different from each other. For example, the first operation may be performed at a first temperature, and the second operation may be performed at a second temperature. The first and second temperatures are different from each other. Accordingly, one of the first and second operations may be performed at a relatively low temperature, and the other operation may be performed at a relatively high temperature. Even when the upper layer 150 is grown in multiple layers, the upper layer 150 may be grown as the same manner as the second buffer layer 130. The relation between the first and second temperatures may be applied between a first pressure and a second pressure, and between a first time and a second time.

The first to third buffer layers 120, 130, and 140 may be collectively referred to as a buffer layer, or may be referred to as a buffer layer including the upper layer 150. The substrate 100 including a compound semiconductor layer and an InP layer based on silicon may be referred to as a meta morphic (MM) buffer layer.

Next, an optical device including the substrate 100 will be described.

Figure 3:
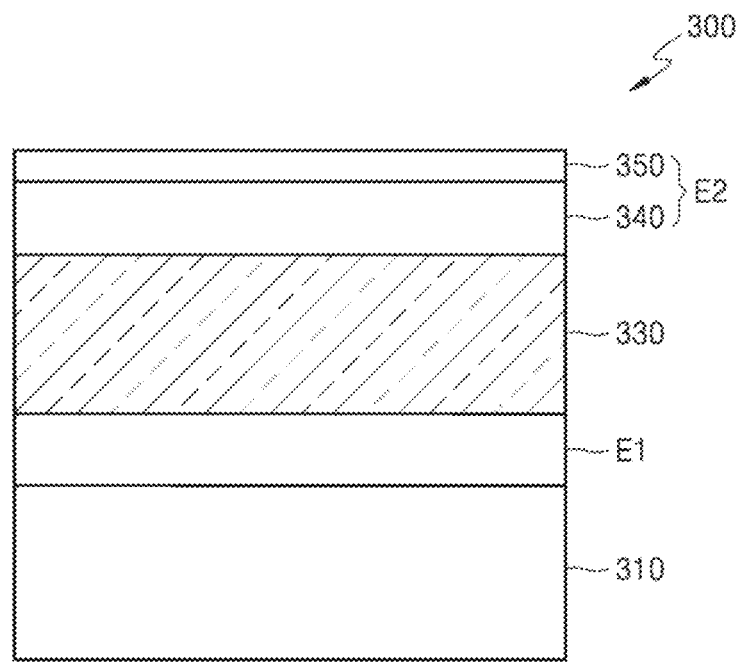
FIG. 3 is a cross-sectional view illustrating an optical device including a substrate according to an example embodiment.

FIG. 3 shows an optical device 300 including a substrate according to an example embodiment. For example, the optical device 300 may be an APD.

Referring to FIG. 3, the optical device 300 may include a sequentially stacked substrate 310, a first stack E1, an absorption layer 330, and a second stack E2. The optical device 300 may be formed such that, after preparing the substrate 310, the first stack E1 is grown on the prepared substrate 310, and then, the absorption layer 330 is grown on the first stack E1, next, the second stack E2 is formed on the absorption layer 330. An epitaxial growth method may be used for the growth of each of the layers, but is not limited thereto.

For example, the substrate 310 may be or include the substrate 100 of FIG. 1. One of the first stack E1 and the second stack E2 may include an n-type contact (electrode), and the other may include a p-type contact (electrode). For example, the first stack E1 may include a multi-layered structure including sequentially stacked first layer 32a, second layer 32b, third layer 32c, and fourth layer 32d as shown in FIG. 4, but is not limited to the four layers.

Figure 4:
FIG. 4 is a cross-sectional view illustrating an example of a layer configuration of a first stack of the optical device of FIG. 3.

Referring to FIG. 4, the first layer 32a is formed directly on the substrate 310 and may be in direct contact with the substrate 310. For example, the first layer 32a is a layer doped with a dopant and may be directly formed on the upper layer 150 of the substrate 100 of FIG. 1 by using an epitaxial growth method, but is not limited thereto. For example, the first layer 32a may be an n+InP layer. The first layer 32a may be referred to as a first cladding layer or an n+ cladding layer. For example, the first layer 32a may be formed to have a thickness in a range of about 0.01 μm to about 10 μm.

When a region of the uppermost layer of the substrate 310 in contact with the first stack E1 is the n+InP layer, the first layer 32a may be omitted in the first stack E1.

The second layer 32b is a layer doped with a dopant, and may be directly formed on the first layer 32a by using an epitaxial growth method, but is not limited thereto. For example, the second layer 32b may be or include an n+InAlAs layer. For example, the second layer 32b may be formed to have a thickness in a range of about 0.05 μm to about 1 μm. For example, when the first layer 32a is omitted, the second layer 32b may be directly grown on the substrate 310.

For example, the third layer 32c may be an undoped layer formed on the second layer 32b. The third layer 32c may be formed by using an epitaxial growth method, but is not limited thereto. For example, the third layer 32c may be or include, but is not limited to, an undoped InAlAs layer. For example, the third layer 32c may be formed to have a thickness in a range of about 0.05 μm to about 1 μm. The fourth layer 32d is a layer doped with a dopant and may be grown on the third layer 32c by using an epitaxial growth method. For example, the fourth layer 32d may be or include, but is not limited to, a p-InAlAs layer. For example, the fourth layer 32d may be formed to have a thickness in a range of about 0.05 μm to about 1 μm. The second to fourth layers 32b to 32d which are the avalanche regions may act as charge multiplication layers that amplify charges collected in the absorption layer 330.

In the first stack E1, the entire first to fourth layers 32a to 32d (when the first layer 32a is omitted, the entire second to fourth layers 32b to 32d) may be used as an electrode layer or an electrode contact layer, but the fourth layer 32d, which is the uppermost layer, may be used as an electrode contact layer.

The absorption layer 330 of FIG. 3 may be a layer that collects charges (e.g., electrons) generated by a photoelectric effect in a light receiving layer included in the second stack E2. For example, the absorption layer 330 is an undoped layer, and may be or include an InGaAs layer. For example, the absorption layer 330 may be formed to a thickness in a range of about 0.1 μm to about 5 μm. The absorption layer 330 may be formed by using an epitaxial growth method, but is not limited thereto. For example, the absorption layer 330 may be a single layer or a multilayer.

The second stack E2 may include a first doped layer 340 and a second doped layer 350 sequentially formed, but is not limited to the two doped layers, and another layer (undoped or doped layer) may further be included. The first doped layer 340 may be formed on the absorption layer 330 by using an epitaxial growth method, but is not limited thereto. The first doped layer 340 may act as a light receiving layer configured to receive incident light, and thus, electrons may be generated in the first doped layer 340 according to the photoelectric effect. For example, the first doped layer 340 may include a material layer showing a predominant photoelectric effect with respect to incident light of a first wavelength rather than other wavelengths. In an example, the first wavelength may belong to an infrared band, but may also belong to a visible light band or an ultraviolet band. When the first wavelength belongs to an infrared band, the first wavelength may belong to a short wavelength infrared (SWIR) band. For example, the first doped layer 340 may be or include a material layer doped with a p-type dopant. For example, the first doped layer 340 may be or include a p-InAlAs layer. For example, the first doped layer 340 may be grown to a thickness in a range of about 0.1 μm to about 2 μm. For example, the second doped layer 350 may be grown on the first doped layer 340 by using an epitaxial growth method, but is not limited thereto. For example, the second doped layer 350 may be formed as a p-type electrode layer or a p-type electrode contact layer. For example, the second doped layer 350 may be or include a p-type InGaAs layer. For example, the p-type InGaAs layer may be a p+InGaAs layer. For example, the second doped layer 350 may be grown to a thickness in a range of about 0.01 μm to about 0.2 μm. For example, the entire second stack E2 may be used as an electrode layer or an electrode contact layer, but the second doped layer 350, which is the uppermost layer, may be used as an electrode contact layer.

Figure 5:
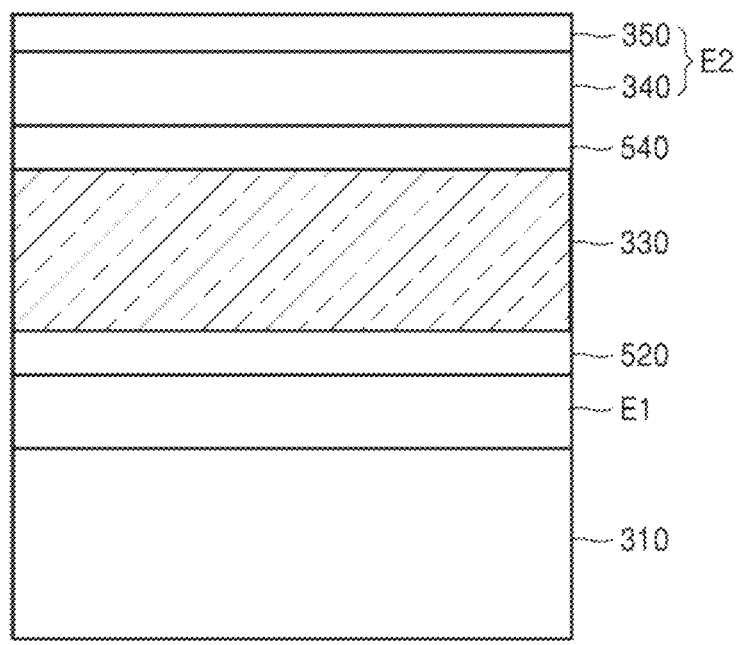
FIG. 5 is a cross-sectional view illustrating a case in which a graded layer is provided above and below an absorption layer in the optical device of FIG. 3.

For example, as shown in FIG. 5, a first graded layer 520 may be provided between the first stack E1 and the absorbing layer 330, and a second graded layer 540 may be provided between the absorbing layer 330 and the first doped layer 340. For example, only one of the first and second graded layers 520 and 540 may be provided. For example, the first and second graded layers 520 and 540 may be formed by using an epitaxial growth method, but is not limited thereto. For example, the first graded layer 520 may be formed to a thickness in a range of about 0.001 μm to about 0.2 μm. For example, the second graded layer 540 may be formed to a thickness in a range of about 0.001 μm to about 0.2 μm.

Because the first and second graded layers 520 and 540 are provided, a band gap between the absorption layer 330 and the fourth layer 32d of the first stack E1 may be graded, and a band gap between the absorption layer 330 and the first doped layer 340 of the second stack E2 may be graded. The first and second graded layers 520 and 540 may function to reduce a band gap between two adjacent layers. For example, the first graded layer 520 may be an undoped layer. For example the first graded layer 520 may be or include an indium gallium aluminum arsenide (InGaAlAs) layer. For example, the second graded layer 540 may be an undoped layer. For example, the second graded layer 540 may be or include an InGaAlAs layer.

Figure 6:
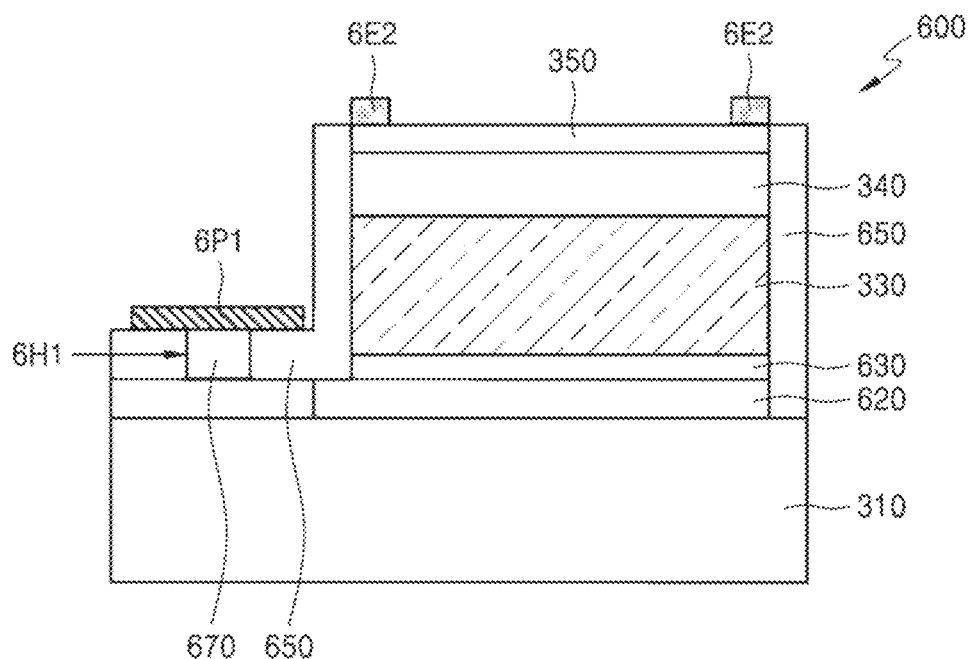
FIG. 6 is a cross-sectional view taken along line 6-6' of FIG. 7 and shows a first optical device in the form of a chip formed on a substrate according to an example embodiment.

FIG. 6 shows an optical device 600 in the form of a chip formed on a substrate according to an example embodiment. Hereinafter, the same reference numerals as the reference numerals mentioned above indicate the same members, and the descriptions thereof will be omitted.

Referring to FIG. 6, an n-type electrode layer 620 is provided on a partial region of a substrate 310. The remaining region of the substrate 310 is covered with an insulating layer 650. For example, the insulating layer 650 may include, but is not limited to, a polyimide layer. The n-type electrode layer 620 may correspond to the first layer 32a of FIG. 4. For example, the n-type electrode layer 620 may be formed by doping a partial region of the substrate 310.

A charge multiplication layer 630, an absorption layer 330, a first doped layer 340, and a second doped layer 350 are sequentially stacked on a partial region of the n-type electrode layer 620. The remaining region of the n-type electrode layer 620 is covered with the insulating layer 650. Side surfaces of the charge multiplication layer 630, the absorption layer 330, the first doped layer 340, and the second doped layer 350 are also covered with the insulating layer 650. The charge multiplication layer 630 may correspond to the second to fourth layers 32b to 32d of FIG. 4. The second doped layer 350 is a p-type electrode contact layer, and an electrode layer 6E2 is disposed thereon. The electrode layer 6E2 may be a conductive layer. The electrode layer 6E2 is provided on an edge of the second doped layer 350, and is in direct contact with the second doped layer 350. The electrode layer 6E2 is in contact with the second doped layer 350 which is a p-type electrode contact layer, and may be referred to as a p-type electrode layer. A first electrode pad 6P1 is provided on the insulating layer 650 covering the remaining region of the n-type electrode layer 620. A via hole 6H1 is formed in the insulating layer 650 between the first electrode pad 6P1 and the n-type electrode layer 620, and the via hole 6H1 is filled with a conductive plug 670. As a result, the first electrode pad 6P1 and the n-type electrode layer 620 are connected to each other by the conductive plug 670. The first electrode pad 6P1 is connected to the n-type electrode layer 620 and may be referred to as an n-type electrode pad.

Figure 7:
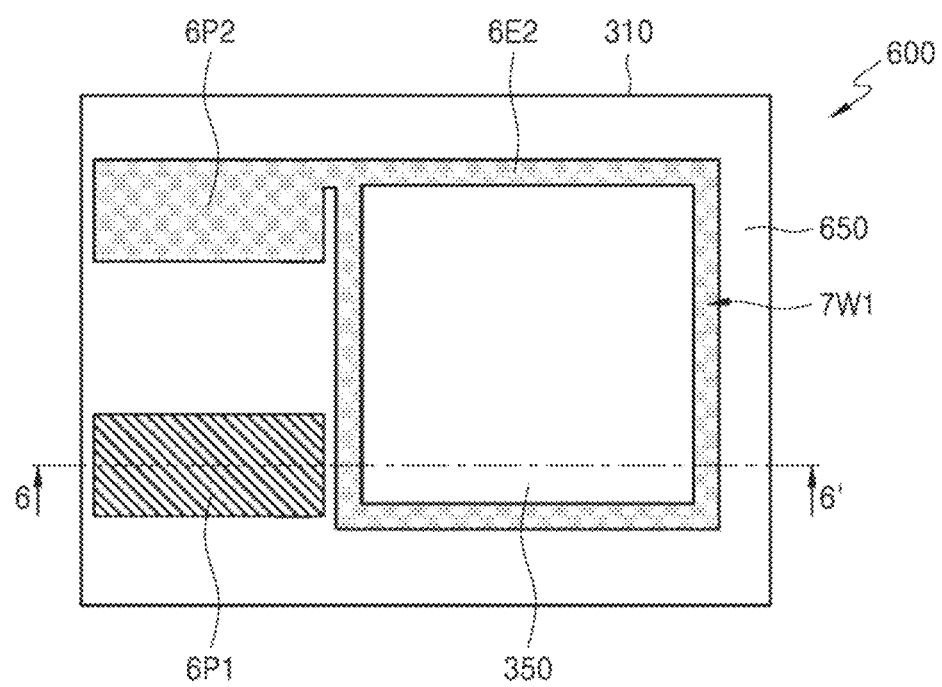
FIG. 7 is a plan view of the optical device shown in FIG. 6.

FIG. 7 is a plan view of the optical device 600 of FIG. 6. FIG. 6 may be a cross-sectional view taken along line 6-6' of FIG. 7.

Referring to FIGS. 6 and 7, the electrode layer 6E2 is disposed along the edge of the second doped layer 350 and has a rectangular shape. An inner region (window) 7W1 of the electrode layer 6E2 of the second doped layer 350 is a region where light is received, and light incident on the inner region (window) 7W1 passes through the second doped layer 350 and is incident on the first doped layer 340 which is a light-receiving layer. To this end, the second doped layer 350 may be a material layer that is transparent to incident light. Because it is advantageous for as much light as possible to be incident on the light receiving layer, the electrode layer 6E2 may be disposed on the second doped layer 350 with a minimized occupying area. A second electrode pad 6P2 is disposed at a position spaced apart from the second doped layer 350. The second electrode pad 6P2 may be disposed parallel to the first electrode pad 6P1, but is not limited thereto. The second electrode pad 6P2 is connected to the electrode layer 6E2. The second electrode pad 6P2 is connected to the second doped layer 350, which is a p-type electrode layer, through the electrode layer 6E2, and the second electrode pad 6P2 may be referred to as a P-type electrode pad. Although the first and second electrode pads 6P1 and 6P2 have a rectangular shape, they are not limited to a rectangular shape and may have other shapes.

Figure 8A:
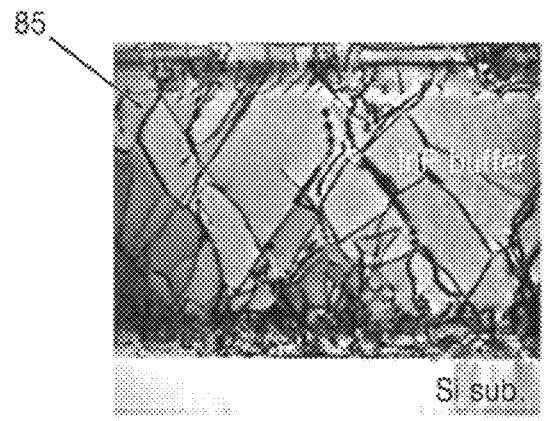
FIGS. 8A and 8B show scanning electron microscope (SEM) images of: a substrate for an optical device according to a related embodiment; and a substrate for an optical device according to an example embodiment.
Figure 8B:
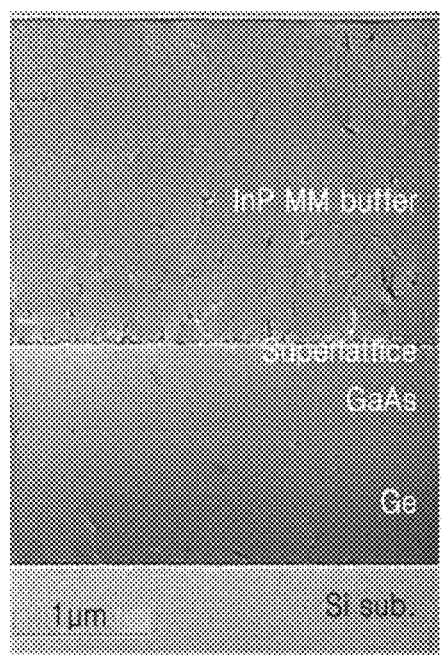

FIGS. 8A and 8B show a scanning electron microscope (SEM) image of a substrate for an optical device according to a related embodiment and substrate for an optical device according to an example embodiment.

FIG. 8A is an SEM image of a related substrate for an optical device in which an InP buffer layer is directly grown on a Si substrate, and FIG. 8B is an SEM image of a substrate for an optical device according to an example embodiment.

Comparing FIGS. 8A and 8B, FIG. 8A illustrates that many dislocations 85 due to lattice mismatch occurred during the growth process. FIG. 8B, where InP is grown by applying a multi-buffer, illustrates that the dislocation due to lattice mismatch during the growth process is greatly reduced. These results suggest that the substrate for an optical device according to an example embodiment is of relatively high quality compared to the related substrate for an optical device.

Figure 9:
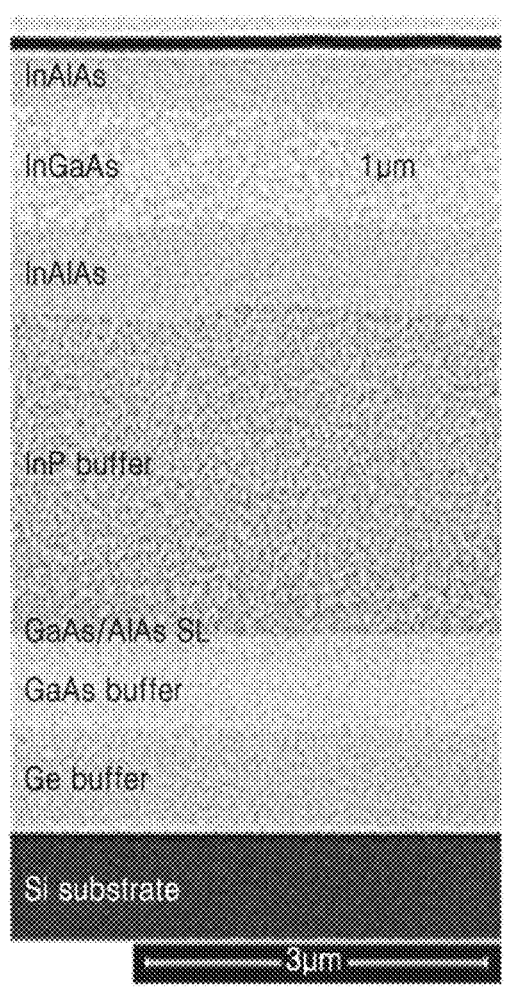
FIG. 9 is an SEM image of the optical device of FIG. 3, and is an SEM image when the thickness of an InGaAs absorption layer is about 1 μm.

FIG. 9 is an SEM image of the optical device (avalanche photodiode) of FIG. 3 when the thickness of an undoped InGaAs absorption layer is about 1 μm.

Figure 10:
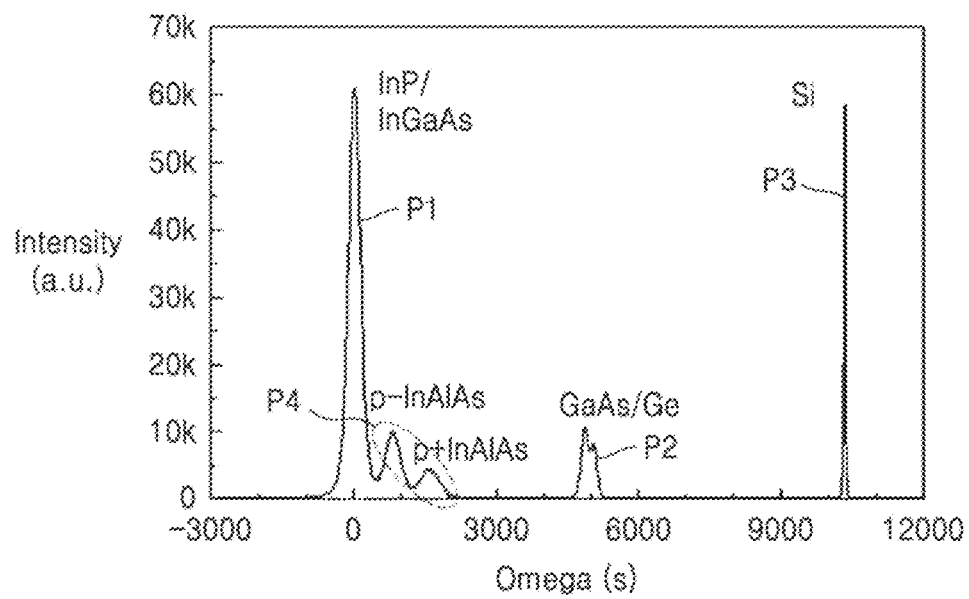
FIG. 10 shows an X-ray diffraction (XRD) spectrum measured at an initial stage of manufacturing of an optical device that is an object of the SEM image of FIG. 9.

FIG. 10 shows an X-ray diffraction (XRD) spectrum measured at an initial stage of manufacturing the optical device that is a target of the SEM image of FIG. 9.

Figure 11:
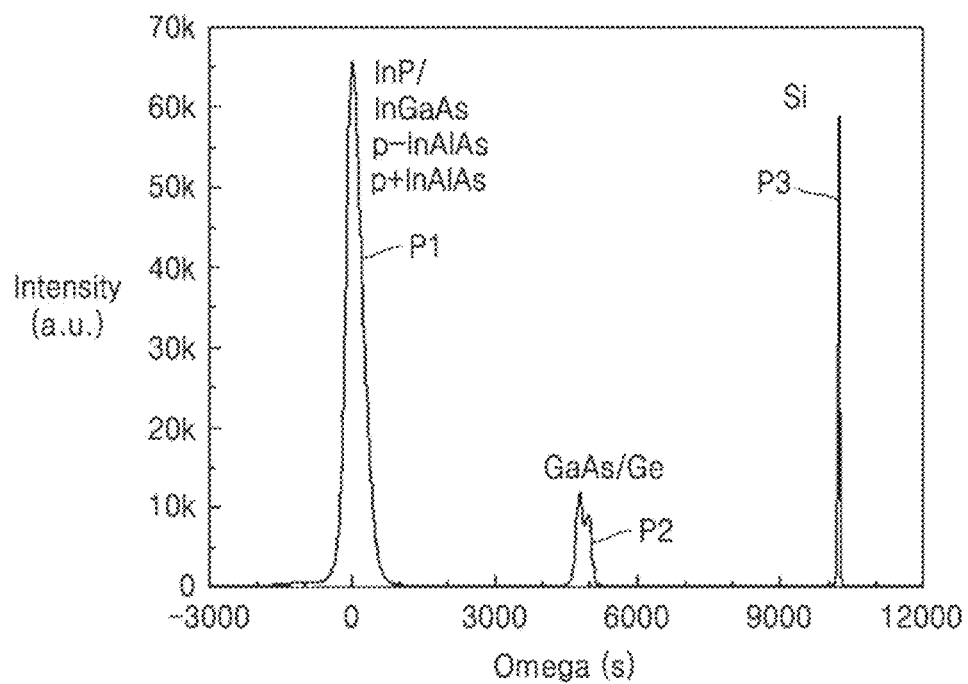
FIG. 11 shows an X-ray diffraction spectrum measured at a final finished form of an optical device that is the object of the SEM image of FIG. 9.

FIG. 11 shows an X-ray diffraction spectrum measured for a finally completed shape of the optical device that is the target of the SEM image of FIG. 9.

Referring to FIGS. 9 to 11, in the initial stage of manufacturing the optical device, as shown in FIG. 10, in addition to a first peak P1, a second peak P2, and a third peak P3, a fourth peak P4 (in FIG. 10) due to lattice mismatch appears, but, in the case of the finally completed optical device, as shown in FIG. 11, only the first to third peaks P1 to P3 appear. These results suggest that all layers constituting an optical device, such as InGaAs and indium aluminum arsenide (InAlAs) are lattice matched with the InP layer.

Figure 12:
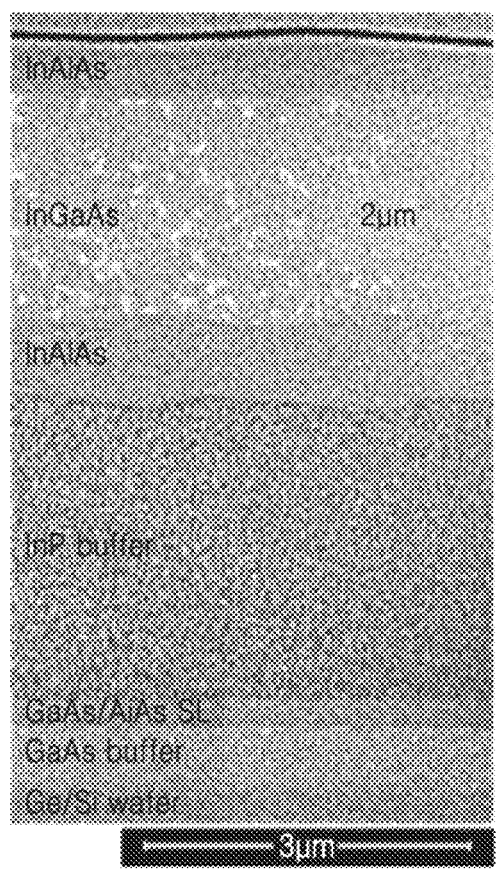
FIG. 12 is an SEM image of the optical device of FIG. 3, and is an SEM image when the thickness of the InGaAs absorption layer is about 2 μm.

FIG. 12 is an SEM image of the optical device (avalanche photodiode) of FIG. 3 when the thickness of an undoped InGaAs absorption layer is about 2 μm.

Figure 13:
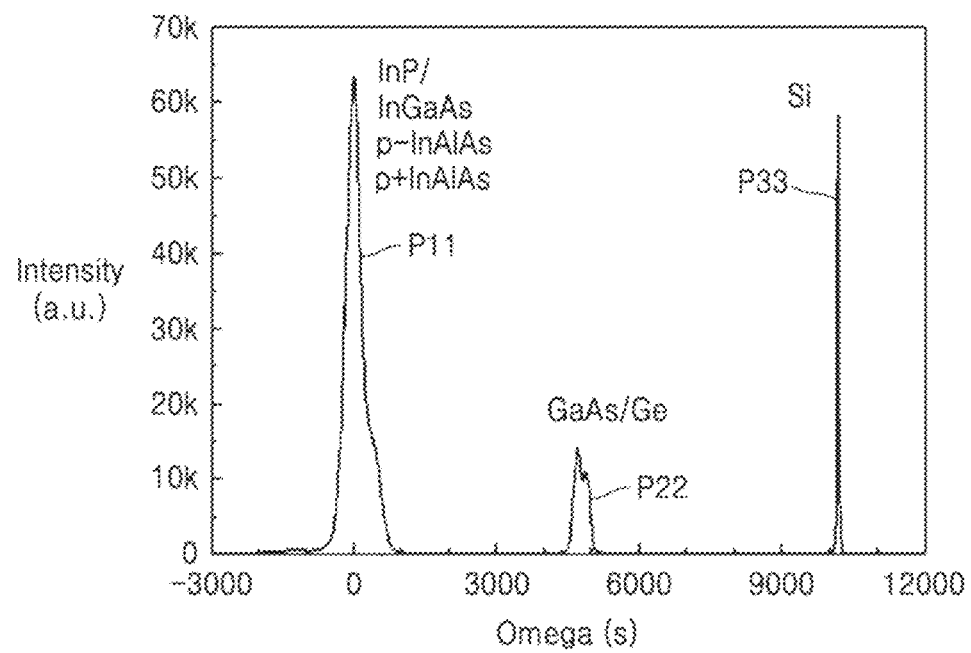
FIG. 13 shows an X-ray diffraction spectrum measured for the final finished form of an optical device that is the object of the SEM image of FIG. 12.

FIG. 13 shows an X-ray diffraction spectrum measured for a finally completed shape of an optical device that is a target of the SEM image of FIG. 12.

The X-ray diffraction spectrum of FIG. 13 includes only the first peak P11, the second peak P22, and the third peak P33, and the positions of the first to third peaks P11, P22, and P33 are the same as the positions of the first to third peaks P1 to P3 of FIG. 12.

The results of FIG. 13 suggest that all layers constituting the optical device, such as InGaAs and InAlAs have lattice matching with the InP layer even when the thickness of the absorption layer 330 of the optical device of FIG. 3 is about 2 μm.

Figure 14:
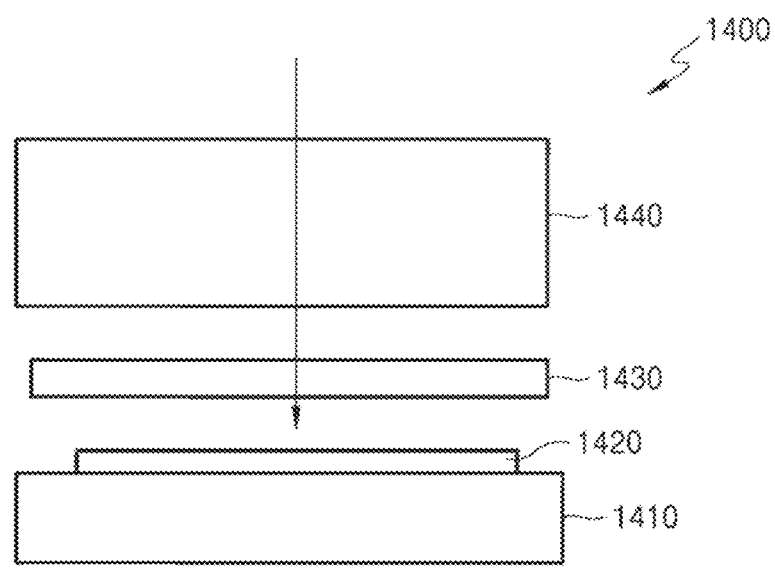
FIG. 14 is a cross-sectional view illustrating an imaging system as an example of an electronic apparatus including an optical device according to an example embodiment.

FIG. 14 shows an imaging system 1400 as an example of an electronic apparatus including an optical device according to an example embodiment. The imaging system 1400 may be a camera.

Referring to FIG. 14, the imaging system 1400 includes a substrate 1410, an image sensor 1420, a filter 1430, and a lens unit 1440. The substrate 1410 may include a circuit for driving the image sensor 1420 and a readout IC. The image sensor 1420 may include a plurality of light receiving elements. The plurality of light receiving elements may form an array. The plurality of light receiving elements may be photoelectric conversion elements. For example, the light receiving elements may be or include the optical device of FIG. 3 which is an example of a photoelectric conversion element. The filter 1430 blocks a portion of incident light so that only light of a specific wavelength or light of a specific wavelength band is incident on the image sensor 1420. For example, the filter 1430 may be a filter that passes at least one of infrared light, visible light, and ultraviolet light. For example, the lens unit 1440 may include a lens optical system for focusing incident light. The lens optical system may include a single lens or a plurality of lenses.

Figure 15:
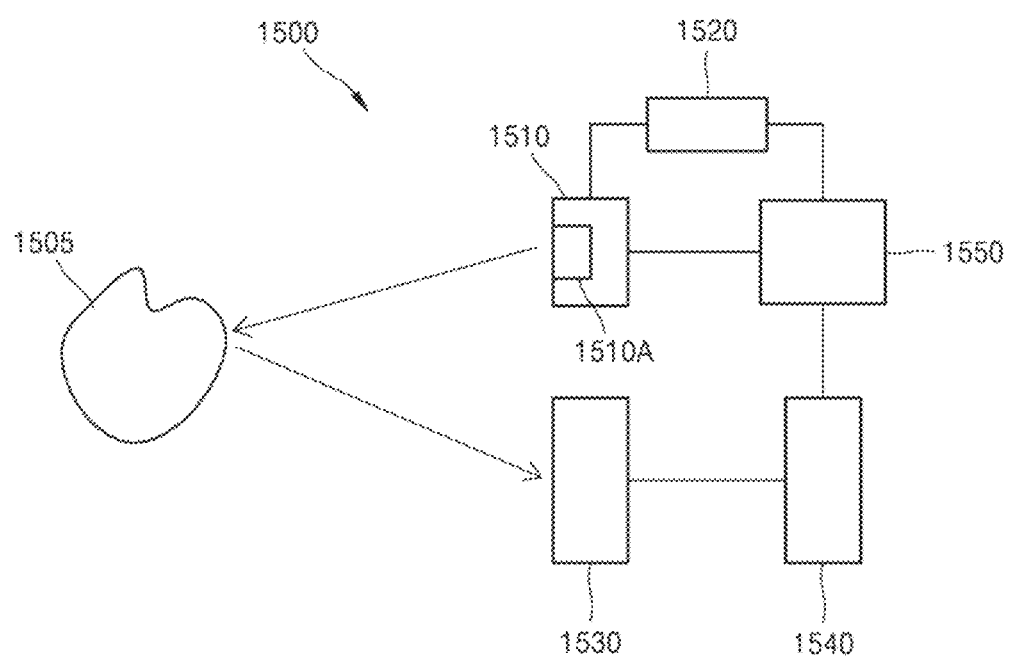
FIG. 15 is a block diagram illustrating a LiDAR device as an example of an electronic apparatus according to an example embodiment.

FIG. 15 shows a light detection and ranging (LiDAR) device 1500 as an example of an electronic device according to an example embodiment. For example, the LiDAR device 1500 may be a vehicle LiDAR device, but is not limited thereto.

Referring to FIG. 15, the LiDAR device 1500 includes a light emitter 1510 configured to emit light to an object 1505, a modulator 1520, a light receiver 1530 configured to receive light reflected from the object 1505, a computation unit 1540 configured to perform a computation to obtain a distance to the object 1505, and a controller 1550 configured to control operations of each unit of the LiDAR device 1500. The object 1505 may be a fixed object (hereinafter, a fixed object) or a moving or movable object (hereinafter, a moving object). The object 1505 may be a natural object or an artificial object. The definition of the fixed object and the movable object may be relative depending on whether the LiDAR device 1500 is fixed or moves. The light emitter 1510 includes a light source 1510A configured to emit light to the object 1505. Light emitted from the light emitter 1510 toward the object 1505 may be a continuous wave or pulsed light (hereinafter, referred to as a light pulse). The light pulse may be periodically emitted. The light pulse may be, for example, a laser pulse. The light source 1510A included in the light emitter 1510 may include, for example, a laser diode. For example, light source 1510A may include a light source that emits continuous light waves.

The modulator 1520 is connected to the light emitter 1510 and the controller 1550. The modulator 1520 may have a configuration to apply a modulation signal (e.g., an amplitude modulation signal or a frequency modulation signal) to the light emitter 1510. The modulator 1520 may be directly connected to the light source 1510A of the light emitter 1510. The modulation signal applied from the modulator 1520 to the light emitter 1510 may be generated using a randomly generated look-up table (LUT). In addition, the modulation signal may be generated by using a unique value or signal provided to the LiDAR device 1500. In this way, a unique modulation operation may be performed for each LiDAR device, and thus, light pulses generated for each LiDAR device may have a unique pattern, thereby preventing or reducing crosstalk between LiDAR devices. The modulator 1520 may include a light modulator for amplitude modulation or frequency modulation. The light receiver 1530 is connected to the computation unit 1540. The light receiver 1530 receives light reflected from the object 1505 and generates an electric signal. The electric signal generated by the light receiver 1530 is transmitted to the computation unit 1540. The light receiver 1530 may include photoelectric conversion elements forming an array. In an example, the photoelectric conversion elements may be the optical device of FIG. 3 or may include the optical device of FIG. 3, but is not limited thereto. The computation unit 1540 includes a time to digital converter (TDC). The computation unit 1540 calculates a time delay based on the electric signal received from the light receiver 1530 by using the TDC and computes a distance between the LiDAR device 1500 and the object 1505. The time delay refers to a time difference between a time point when light is emitted from the light emitter 1510 toward the object 1505 and a time point when the light reflected from the object 1505 is received by the light receiver 1530. The operation of emitting light from the light emitter 1510 is controlled by the controller 1550. The controller 1550 simultaneously provides a light emission start signal to the light emitter 1510 and the computation unit 1540. In this way, because the computation unit 1540 may know the light emission time of the light emitter 1510, and know the light receiving time based on the electric signal provided from the light receiver 1530, the computation unit 1540 may calculate a time delay. The computation unit 1540 receives information about the modulated light pulse emitted from the light emitter 1510 from the controller 1550. The computation unit 1540, based on the received information, calculates a time delay only for the modulated light pulses emitted from the light emitter 1510 among lights received by the light receiver 1530, and performs an operation for calculating a distance to the object 1505. The distance information obtained by the operation of the computation unit 1540 is provided to the controller 1550. The controller 1550 may control operations of the modulator 1520, the light receiver 1530, and the computation unit 1540 together with the operation of the light emitter 1510. The controller 1550 may include a central processing unit. The controller 1550 may include a computer (PC). The LiDAR device 1500 may be applied to various fields, for example, autonomous driving apparatuses, such as vehicles or drones, depth cameras, robot navigations, military and medical fields, and the like, and the configuration of the controller 1550 may be slightly different depending on the application fields.

The substrate for an optical device according to the above-described example embodiment or an optical device including the substrate may be applied to various electronic apparatuses that require an optical device causing a photoelectric conversion action in addition to the electronic apparatuses shown in FIGS. 13 and 14. The optical device may be mounted on electronic devices, for example, smart phone, wearable device, AR and VR device, Internet of Things (IoT) device, home appliance, tablet personal computer (PC), personal digital assistant (PDA), portable multimedia player (PMP), navigation, drones, robots, unmanned vehicles, autonomous vehicles, advanced driver assistance systems (ADAS), and the like.

Figure 16:
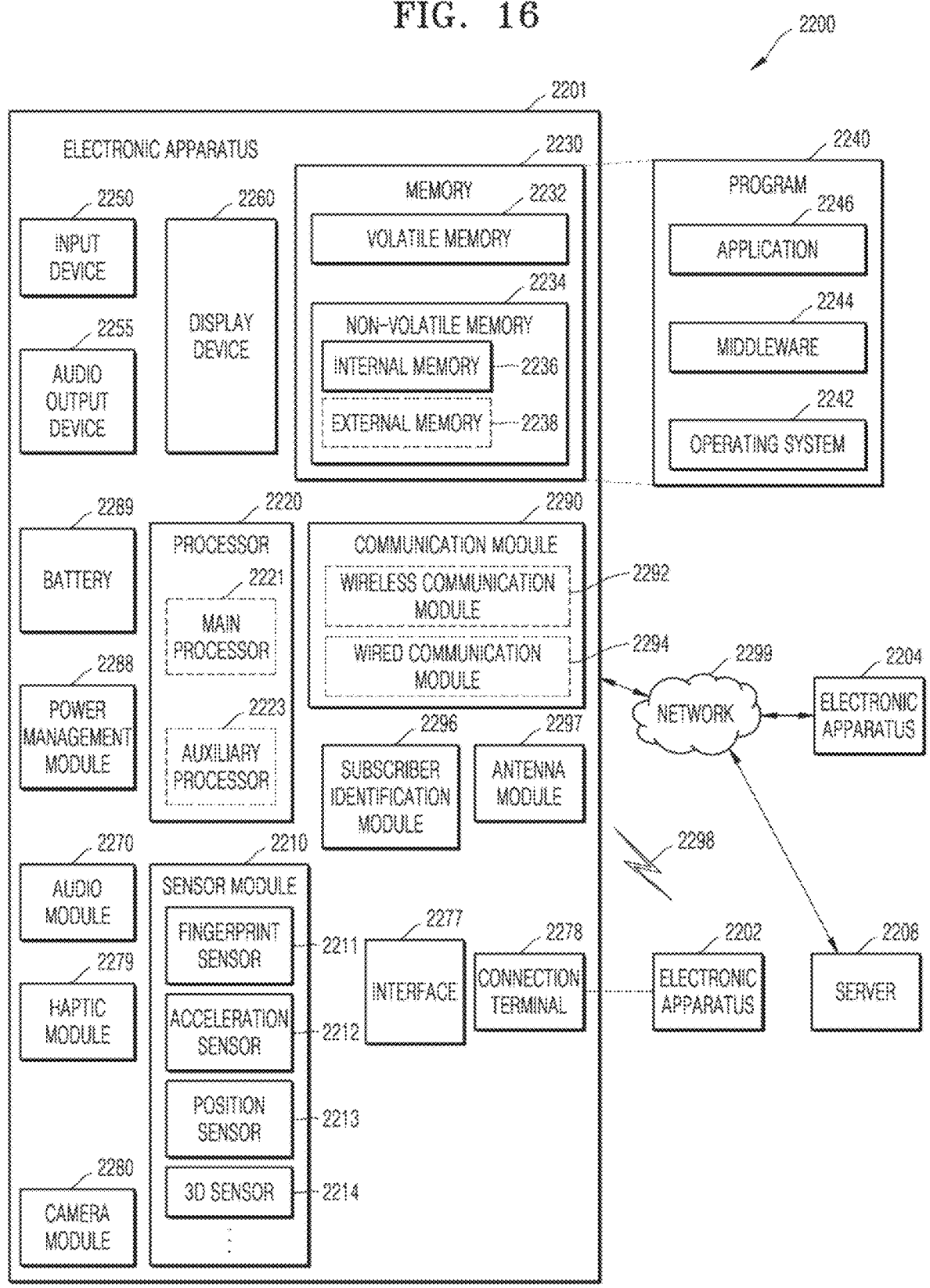
FIG. 16 is a block diagram illustrating an electronic apparatus according to an example embodiment.
Figure 17:
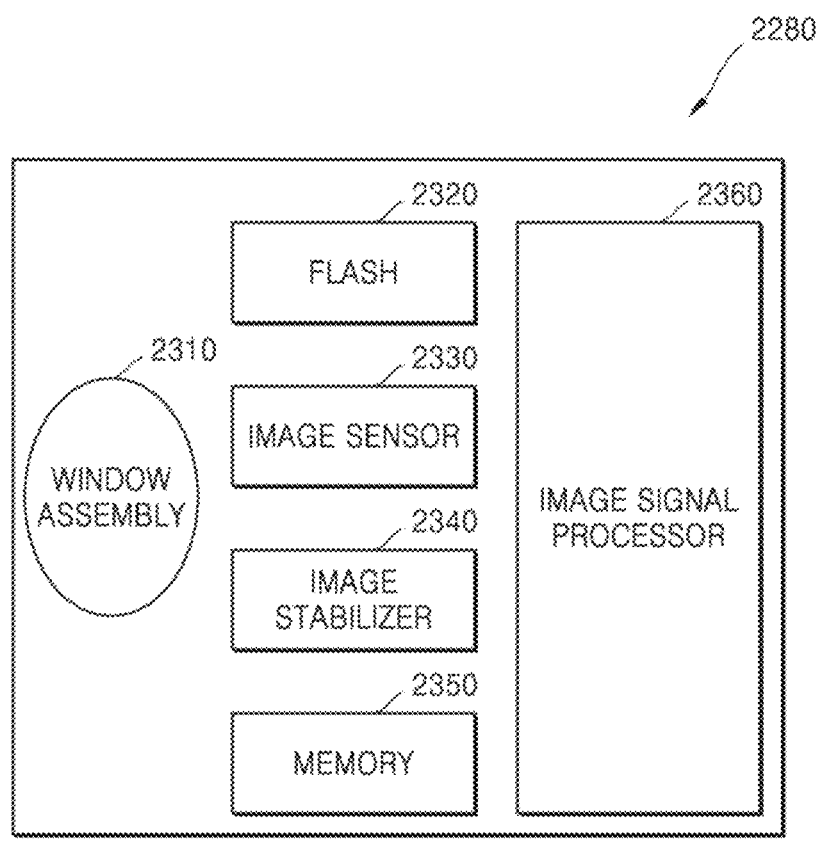
FIG. 17 is a block diagram illustrating a schematic configuration of a camera module included in the electronic apparatus of FIG. 16.
Figure 18:
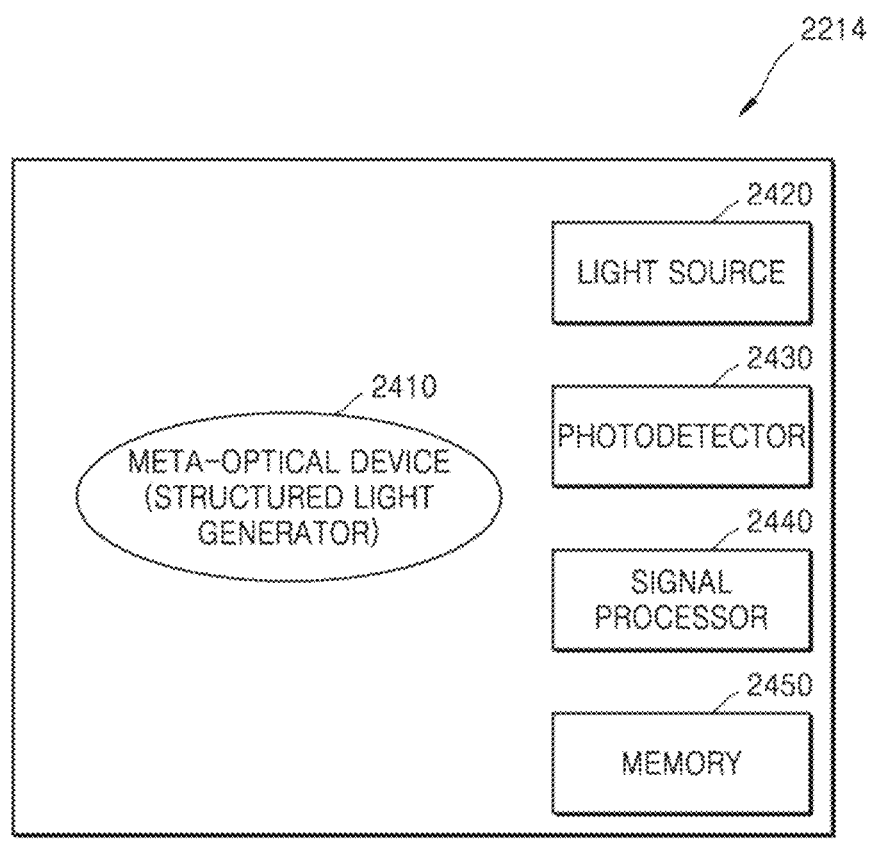
FIG. 18 is a block diagram illustrating a schematic configuration of a 3D sensor provided in the electronic apparatus of FIG. 16.

FIGS. 16 to 18 show electronic devices according to example embodiments.

FIG. 16 shows a schematic configuration of an electronic apparatus 2201 according to an example embodiment.

Referring to FIG. 16, the electronic apparatus 2201 in a network environment 2200 includes various devices and modules as shown.

A camera module 2280, which is one of the modules, may capture still images and moving images. For example, the camera module 2280 may include the imaging system 1400 of FIG. 14. For example, the camera module 2280 may include a member (e.g., a window assembly) configured to collect and focus incident light at a given position, image sensors, image signal processors, and/or flashes. The image sensors may include a plurality of photoelectric conversion elements. For example, the photoelectric conversion elements may include the optical device of FIGS. 3 to 5.

The power management module 2288 may manage power supplied to the electronic apparatus 2201. The power management module 2288 may be implemented as part of a Power Management Integrated Circuit (PMIC).

A battery 2289 may supply power to components of the electronic apparatus 2201. The battery 2289 may include a non-rechargeable primary cell, a rechargeable secondary cell, and/or a fuel cell.

A communication module 2290 may establish a direct (wired) communication channel and/or wireless communication channel between the electronic apparatus 2201 and other electronic apparatuses (an electronic apparatus 2202, an electronic apparatus 2204, a server 2208, etc.); and support communication through the established communication channel. The communication module 2290 may include one or more communication processors configured to operate independently from the processor 2220 (such as an application processor) and support direct communication and/or wireless communication. The communication module 2290 may include a wireless communication module 2292 (a cellular communication module, a short-range wireless communication module, a Global Navigation Satellite System (GNSS, etc.) communication module) and/or a wired communication module 2294 (Local Area Network (LAN) communication module, power line communication module, etc.). Among these communication modules, the corresponding communication module may communicate with other electronic devices through a first network 2298 (a short-range communication network, such as Bluetooth, WiFi Direct, or Infrared Data Association (IrDA)), or a second network 2299 (a telecommunication network, such as a cellular network, the Internet, or a computer network (LAN), WAN, etc.). These various types of communication modules may be integrated into one component (single chip, etc.) or implemented as a plurality of components (plural chips) separate from each other. The wireless communication module 2292 may identify and authenticate the electronic apparatus 2201 within a communication network, such as the first network 2298 and/or the second network 2299 by using subscriber information stored in the subscriber identification module 2296 (such as an International Mobile Subscriber Identifier (IMSI)).

The antenna module 2297 may transmit or receive signals and/or power to and from the outside (other electronic devices, etc.). The antenna may include a radiator having a conductive pattern formed on a substrate (PCB, etc.). The antenna module 2297 may include one or a plurality of antennas. When a plurality of antennas are included, an antenna suitable for a communication method used in a communication network such as the first network 2298 and/or the second network 2299 is selected from among the plurality of antennas by the communication module 2290. Signals and/or power may be transmitted or received between the communication module 2290 and another electronic apparatus through the selected antenna. In addition to the antenna, other components (RFIC, etc.) may be included as a part of the antenna module 2297.

Some of the components are connected to each other through communication methods between peripheral devices (bus, general purpose input and output (GPIO), serial peripheral interface (SPI), mobile industry processor interface (MIPI), etc.) and signals (commands, data, etc.) are interchangeable.

The command or data may be transmitted or received between the electronic apparatus 2201 and the external electronic apparatus 2204 through the server 2208 connected to the second network 2299. The other electronic apparatuses 2202 and 2204 may be the same type as or different type from that of the electronic apparatus 2201. All or some of the operations executed in the electronic apparatus 2201 may be executed in one or more of the other electronic apparatuses 2202, 2204, and 2208. For example, when the electronic apparatus 2201 needs to perform a function or service, the electronic apparatus 2201 may request one or more other electronic devices to perform part or all of the function or service instead of executing the function or service itself. One or more other electronic apparatuses receiving the request may execute an additional function or service related to the request, and transmit a result of the execution to the electronic apparatus 2201. To this end, cloud computing, distributed computing, and/or client-server computing technologies may be used.

FIG. 17 is a block diagram illustrating a schematic configuration of a camera module included in the electronic device of FIG. 16.

Referring to FIG. 17, the camera module 2280 includes a window assembly 2310, a flash 2320, an image sensor 2330, an image stabilizer 2340, a memory 2350 (buffer memory, etc.), and/or an image signal processor 2360. The window assembly 2310 may collect light emitted from an object to be imaged, and include a filter layer and an anti-reflection film.

The camera module 2280 may include a plurality of window assemblies 2310, and in this case, the camera module 2280 may be a dual camera, a 360° camera, or a spherical camera. The plurality of window assemblies 2310 may have the same optical characteristic (angle of view, focal length, auto focus, F number, optical zoom, etc.) or may have different optical characteristics. The window assembly 2310 may include optical characteristics corresponding to a wide-angle lens or a telephoto lens.

The flash 2320 may emit light used to enhance light emitted or reflected from an object. The flash 2320 may include one or more light emitting diodes (Red-Green-Blue (RGB) LED, White LED, Infrared LED, Ultraviolet LED, etc.), and/or a Xenon Lamp. The image sensor 2330 may acquire an image corresponding to an object by converting light emitted or reflected from the object and transmitted through the window assembly 2310 into an electrical signal. The image sensor 2330 may include the optical device described with reference to FIGS. 3 to 5 as a photoelectric conversion element.

The image stabilizer 2340 may compensate for a negative effect of movement by moving the window assembly 2310 or the image sensor 2330 in a specific direction or controlling the operational characteristics (adjustment of read-out timing, etc.) of the image sensor 2330 in response to the movement of the camera module 2280 or an electronic apparatus 2201 including the same. The image stabilizer 2340 may detect the movement of the camera module 2280 or the electronic apparatus 2201 by using a gyro sensor or an acceleration sensor disposed inside or outside the camera module 2280. The image stabilizer 2340 may be optically implemented.

The memory 2350 may store some or all data of an image acquired through the image sensor 2330 for a next image processing operation. For example, when a plurality of images are acquired at high speed, the acquired original data (Bayer-Patterned data, high-resolution data, etc.) is stored in the memory 2350 and only a low-resolution image is displayed, and then, the original data of the selected (user selected, etc.) image is transmitted to the image signal processor 2360. The memory 2350 may be integrated into the memory 2230 of the electronic apparatus 2201 or may be configured as a separate memory operated independently. The memory 2350 may also include a restoration algorithm for an image restoration operation to be performed by the image signal processor 2360.

The image signal processor 2360 may perform one or more image processing on an image acquired through the image sensor 2330 or image data stored in the memory 2350. The one or more image processing may include generating a depth map, three-dimensional modeling, creating a panorama, extracting feature points, synthesizing an image, image restoration, and/or image compensation (noise reduction, resolution adjustment, brightness adjustment, blurring, sharpening, softening, etc.). The image signal processor 2360 may perform control (exposure time control or readout timing control, etc.) on components (the image sensor 2330, etc.) included in the camera module 2280. The image processed by the image signal processor 2360 may be stored back in the memory 2350 for further processing or provided to external components of the camera module 2280 (the memory 2230, a display device 2260, the electronic apparatus 2202, the electronic apparatus 2204, the server 2208, etc.). The image signal processor 2360 may be integrated into the processor 2220 or configured as a separate processor independently operated from the processor 2220. When the image signal processor 2360 is configured as a separate processor from the processor 2220, an image processed by the image signal processor 2360 is additionally processed by the processor 2220, and then, is displayed on the display device 2260.

The electronic apparatus 2201 may include a plurality of camera modules 2280 each having different properties or functions. In this case, one of the plurality of camera modules 2280 may be a wide-angle camera, and the other may be a telephoto camera. Similarly, one of the plurality of camera modules 2280 may be a front camera and the other may be a rear camera.

FIG. 18 is a block diagram illustrating a schematic configuration of the three-dimensional (3D) sensor 2214 provided in the electronic apparatus 2201 of FIG. 16.

The 3D sensor 2214 senses a shape, movement, etc. of an object by emitting a predetermined light to the object and receiving and analyzing light reflected from the object. The 3D sensor 2214 includes a light source 2420, a meta-optical element 2410, a photodetector 2430, a signal processor 2440, and a memory 2450. As the meta-optical element 2410, a meta-optical element in which a phase profile is set to function as a structured light generator may be employed.

The light source 2420 emits light to be used for analyzing the shape or position of the object. The light source 2420 may include a light source configured to generate and emit light of a predetermined wavelength. The light source 2420 may include a light source that generates and emits light of a wavelength band suitable for analyzing the position and shape of an object, for example, light of an infrared band wavelength, such as laser diode (LD), light emitting diode LED), super luminescent diode (SLD), etc. The light source 2420 may be a wavelength tunable laser diode. The light source 2420 may generate and emit light of a plurality of different wavelength bands. The light source 2420 may generate and emit pulsed light or continuous light.

The meta-optical element 2410 modulates light emitted from the light source 1100 and transmits the modulated light to the object. The meta optical element 2410 modulates incident light so that the incident light has a distribution having a predetermined pattern. The meta-optical element 2410 may form structured light in which predetermined position coordinates are coded as bright and dark spots to be suitable for 3D shape analysis.

As described above, the meta-optical element 2410 has a relatively high efficiency of forming an intended structured light pattern, and may improve the accuracy of 3D information analysis of an object because the shape distribution of a nanostructure is designed in consideration of a phase change rate as well as a phase value for each position.

The photodetector 2430 receives reflected light of light emitted to the object via the meta-optical element 2410. The photodetector 2430 may include an array of a plurality of sensors configured to sense light, or include only one sensor. In the photodetector 2430, the optical device described with reference to FIGS. 3 to 5 may be employed as a photoelectric conversion element.

The signal processor 2440 may process a signal sensed by the photodetector 2430 to analyze the shape of an object. The signal processor 2440 may analyze a 3D shape including a depth position of the object.

When structured light is emitted to an object, a depth position of the object may be calculated from a change in the pattern of the structured light reflected from the object, that is, a result of comparison with the pattern of incident structured light. Depth information of an object may be extracted by tracking the pattern change for each coordinate of structured light reflected from the object, and 3D information related to the shape and movement of the object may be extracted from the depth information.

The memory 2450 may store programs and other data necessary for the operation of the signal processor 2440.

An operation result of the signal processor 2440, that is, information on the shape and location of the object, may be transmitted to another unit in the electronic apparatus 2201 or to another electronic apparatus. For example, such information may be used by an application 2246 stored in the memory 2230. The other electronic apparatus to which the result is transmitted may be a display device or printer that outputs the result, and in addition, may be autonomous driving devices, such as unmanned vehicles, autonomous vehicles, robots, drones, smart phones, smart watches, cell phones, personal digital assistants (PDAs), laptops, PCs, various wearable devices, other mobile or non-mobile computing devices, and Internet of Things devices, but not limited thereto.

In the case of the disclosed substrate for an optical device, as a silicon-based InP substrate, a multi-layer buffer is formed between a lower silicon layer and an upper InP layer. In the case of the lower silicon layer, the crystal growth direction is inclined at a given angle with respect to the vertical direction unlike a normal silicon layer. Due to the action of the silicon layer and the multilayer buffer, lattice mismatch of each layer during the formation of the substrate is reduced, and thus, the generation of defects at an interface of each layer may be minimized or prevented. As a result, an InP substrate based on silicon and having a high-quality surface may be formed.

Accordingly, when an optical device (e.g., an avalanche photodiode) is manufactured by using the disclosed InP substrate for an optical device, an optical device having a superior performance may be manufactured compared to the related art.

In addition, because the disclosed high-quality substrate is based on silicon, it is possible to directly form a Group III-V compound semiconductor photodetector device on a silicon substrate and apply it to a system, thereby facilitating the manufacturing process and lowering the manufacturing cost.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An optical device comprising:
a substrate;
a first stack on the substrate;
a second stack facing the first stack;

an absorption layer between the first stack and the second stack; and
wherein the substrate comprises:
　a silicon layer;
　a multilayer buffer layer on an upper surface of the silicon layer; and
　　an indium phosphide (InP) layer on the multilayer buffer layer,
　wherein a crystal growth direction of the silicon layer is a direction inclined by 1° to 10° with respect to a vertical direction,
　wherein the multilayer buffer layer is in contact with the upper surface and comprises a buffer layer in which a crystal growth direction is inclined with respect to the vertical direction,
　wherein the multilayer buffer layer further comprises:
　　a first buffer layer on the silicon layer;
　　a second buffer layer on the first buffer layer; and
　　a third buffer layer on the second buffer layer, and
　wherein the first buffer layer comprises a germanium (Ge) layer,
　wherein the third buffer layer comprises superlattice layers.

2. The optical device of claim 1,
wherein a crystal growth direction of the first buffer layer is inclined with respect to the vertical direction.

3. The optical device substrate of claim 2,
wherein the crystal growth direction of the first buffer layer is inclined by 1° to 10° with respect to the vertical direction.

4. The optical device substrate of claim 2, wherein the second buffer layer is a single layer or multilayer comprising at least a gallium arsenide (GaAs) layer having a thickness in a range of 0.01 μm to 100 μm.

5. The optical device substrate of claim 2, wherein the third buffer layer comprises:
　a first layer; and
　a second layer on the first layer,
　wherein the first layer and the second layer are repeatedly and alternately stacked, and
　wherein the first layer and the second layer are each a superlattice layer.

6. The optical device substrate of claim 5, wherein one of the first layer and the second layer comprises a gallium arsenide (GaAs) layer, an indium gallium arsenide (InGaAs) layer, or an indium gallium aluminum arsenide (InGaAlAs) layer, and
　wherein the other of the first layer and the second layer comprises an aluminum arsenide (AlAs) layer, an InAlAs layer, or an InGaAlAs layer.

7. The optical device substrate of claim 1, wherein the InP layer comprises an n+InP layer having a thickness in a range of 0.01 μm to 100 μm.

8. The optical device substrate of claim 1, wherein the InP layer is a single layer or multilayer.

9. The optical device of claim 1, wherein a surface of the InP layer comprises an n+InP layer.

10. The optical device of claim 9, wherein the first stack is configured as a charge multiplication layer, and comprises:
　an n-type doped layer;
　an undoped layer on the n-type doped layer; and
　a p-type doped layer on the undoped layer.

11. The optical device of claim 9, further comprising a graded layer between the absorption layer and at least one of the first stack and the second stack, the graded layer being configured to mitigate a band gap difference between the absorption layer and at least one of the first stack and the second stack.

12. The optical device of claim 1, wherein the second stack comprises:
　a first p-type doped layer on the absorption layer, the first p-type doped layer being a light-receiving layer; and
　a second p-type doped layer on the first p-type doped layer, the second p-type doped layer being a p-type electrode contact.

13. An electronic apparatus comprising the optical device of claim 1.

14. A method of manufacturing an optical device, the method comprising:
　forming a substrate;
　forming a first stack on the substrate;
　forming a second stack facing the first stack; and
　forming an absorption layer between the first stack and the second stack,
　wherein forming the substrate comprises:
　　forming a silicon layer having a crystal growth direction inclined at a given angle with respect to a vertical direction;
　　forming a multilayer buffer layer to contact an upper surface of the silicon layer; and
　　forming an indium phosphide (InP) layer on the multilayer buffer layer,
　wherein among the multilayer buffer layer, a buffer layer formed directly on the silicon layer is grown in a crystal growth direction of the silicon layer to reduce defects at an interface between the silicon layer and the buffer layer,
　wherein forming the multilayer buffer layer comprises forming:
　　growing a first buffer layer on the silicon layer;
　　growing a second buffer layer on the first buffer layer; and
　　growing a third buffer layer on the second buffer layer, and
　wherein the first buffer layer comprises a germanium (Ge) layer,
　wherein the growing the third buffer layer comprises forming superlattice layers.

15. The method of claim 14, wherein the growing the second buffer layer comprises:
　a first operation of growing a first portion of the second buffer layer; and
　a second operation of growing a second portion other than the first portion of the second buffer layer, under conditions different from conditions of the first operation.

16. The method of claim 15, wherein the conditions of the first operation are different from the conditions of the second operation, and
　wherein the conditions of the first operation and the conditions of the second operation comprise at least one of a temperature condition, a pressure condition, a speed condition, and a time condition.

17. The method of claim 14, wherein the forming the InP layer comprises:
　a first operation of growing a first portion of the InP layer under a first condition; and
　a second operation of growing a second portion other than the first portion of the InP layer, under a second condition different from the first condition.

18. The method of claim 17, wherein the first condition and the second condition comprise at least one of a temperature condition, a pressure condition, a speed condition, and a time condition.

19. The method of claim 14, wherein the forming of the InP layer comprises forming a single layer or multilayer.

20. An optical device comprising:
- a substrate;
- a first stack on the substrate;
- a second stack facing the first stack;
- an absorption layer between the first stack and the second stack; and
- wherein the substrate comprises:
  - a silicon layer;
  - a buffer layer on an upper surface of the silicon layer; and
  - an indium phosphide (InP) layer on the buffer layer,
  - wherein a crystal growth direction of the silicon layer is a direction inclined by 1° to 10° with respect to a vertical direction,
  - wherein the buffer layer is in contact with the upper surface and has a crystal growth direction inclined with respect to the vertical direction, and
  - wherein the buffer layer comprises a unary semiconductor layer and a binary or more compound semiconductor layer, and
  - wherein the buffer layer further comprises superlattice layers.

* * * * *